(12) United States Patent
Jones et al.

(10) Patent No.: US 8,637,964 B2
(45) Date of Patent: Jan. 28, 2014

(54) LOW STRAY INDUCTANCE POWER MODULE

(75) Inventors: Patrick Jones, Soest (DE); Andre Christmann, Novi, MI (US); Daniel Domes, Rüthen (DE)

(73) Assignee: Infineon Technologies AG, Neubiberg (DE)

( * ) Notice: Subject to any disclaimer, the term of this patent is extended or adjusted under 35 U.S.C. 154(b) by 275 days.

(21) Appl. No.: 13/281,548

(22) Filed: Oct. 26, 2011

(65) Prior Publication Data

US 2013/0105960 A1 May 2, 2013

(51) Int. Cl.
*H01R 9/00* (2006.01)
*H01L 31/119* (2006.01)

(52) U.S. Cl.
USPC ............... 257/668; 363/97; 363/98; 257/691

(58) Field of Classification Search
USPC .............. 363/95, 97, 98, 131, 144, 146, 147, 363/132, 141; 29/592.1, 596, 825, 830; 257/690, 691, 341, 343, 401
See application file for complete search history.

(56) References Cited

U.S. PATENT DOCUMENTS

| | | | | |
|---|---|---|---|---|
| 6,212,087 B1* | 4/2001 | Grant et al. | ........... | 363/144 |
| 6,249,024 B1* | 6/2001 | Mangtani | ........... | 257/341 |
| 6,381,161 B2* | 4/2002 | Mourick | ........... | 363/147 |
| 6,407,508 B1* | 6/2002 | Kawada et al. | ........... | 315/169.3 |
| 6,845,017 B2* | 1/2005 | Ahmed et al. | ........... | 361/775 |
| 7,505,294 B2* | 3/2009 | Ahmed et al. | ........... | 363/141 |
| 7,676,911 B2* | 3/2010 | Flett | ........... | 29/825 |
| 8,045,352 B2* | 10/2011 | Kanie et al. | ........... | 363/144 |
| 2002/0017714 A1* | 2/2002 | Choi | ........... | 257/706 |
| 2002/0118560 A1* | 8/2002 | Ahmed et al. | ........... | 363/144 |
| 2006/0028806 A1* | 2/2006 | Parkhill et al. | ........... | 361/775 |
| 2006/0290689 A1* | 12/2006 | Grant et al. | ........... | 345/204 |
| 2007/0193763 A1* | 8/2007 | Parkhill et al. | ........... | 174/32 |
| 2008/0054298 A1* | 3/2008 | Stevanovic et al. | ........... | 257/177 |
| 2013/0015495 A1* | 1/2013 | Hauenstein | ........... | 257/140 |

* cited by examiner

*Primary Examiner* — Steven Loke
*Assistant Examiner* — David Goodwin
(74) *Attorney, Agent, or Firm* — Murphy, Bilak & Homiller, PLLC

(57) ABSTRACT

A power module includes a substrate including an insulating member and a patterned metallization on the insulating member. The patterned metallization is segmented into a plurality of spaced apart metallization regions. Adjacent ones of the metallization regions are separated by a groove which extends through the patterned metallization to the insulating member. A first power transistor circuit includes a first power switch attached to a first one of the metallization regions and a second power switch attached to a second one of the metallization regions adjacent a first side of the first metallization region. A second power transistor circuit includes a third power switch attached to the first metallization region and a fourth power switch attached to a third one of the metallization regions adjacent a second side of the first metallization region which opposes the first side. The second power transistor circuit mirrors the first power transistor circuit.

22 Claims, 5 Drawing Sheets

LOW STRAY INDUCTANCE POWER MODULE

TECHNICAL FIELD

The present application relates to power modules, in particular power modules with a low stray inductance.

BACKGROUND

Efficiency within an IGBT (insulated gate bipolar transistor) power module is a major challenge when designing new power modules. One factor that affects the efficiency of a power module is stray inductance. Stray inductance is directly influenced by the design of the power module and less by the basic physics of the module. Conventional IGBT power module designs tend to sacrifice stray inductance in order to increase power density of the module. This normally includes separating the positive (+) and negative (−) DC paths on the substrate, laterally bonding across the main current flow path to ease the bonding of the power transistor chips to various potentials in the power module, and/or providing repetitive layouts for the ease of manufacture due to the number of common elements present in the module. In each case, the result is an increase in stray inductance within the power module and thus reduced efficiency.

SUMMARY

The embodiments described herein minimize stray inductance within a power module, and also outside the power module for the transportation of electric current out of the power module and through the system in which the power module is used. The amount of power extracted from the module is increased by reducing the stray inductance.

According to an embodiment of a power module, the power module includes a substrate including an insulating member and a patterned metallization on the insulating member. The patterned metallization is segmented into a plurality of spaced apart metallization regions. Adjacent ones of the metallization regions are separated by a groove which extends through the patterned metallization to the insulating member. A first power transistor circuit includes a first power switch attached to a first one of the metallization regions and a second power switch attached to a second one of the metallization regions adjacent a first side of the first metallization region. A second power transistor circuit includes a third power switch attached to the first metallization region and a fourth power switch attached to a third one of the metallization regions adjacent a second side of the first metallization region which opposes the first side. The second power transistor circuit mirrors the first power transistor circuit.

According to another embodiment of a power module, the power module includes a substrate including an insulating member and a patterned metallization on the insulating member. The patterned metallization is segmented into a plurality of spaced apart metallization regions. Adjacent ones of the metallization regions are separated by a groove which extends through the patterned metallization to the insulating member. A first half-bridge circuit includes a first power switch attached to a first one of the metallization regions and a second power switch attached to a second one of the metallization regions adjacent a first side of the first metallization region. A second half-bridge circuit includes a third power switch attached to the first metallization region and a fourth power switch attached to a third one of the metallization regions adjacent a second side of the first metallization region which opposes the first side. The second half-bridge circuit mirrors the first half-bridge circuit.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
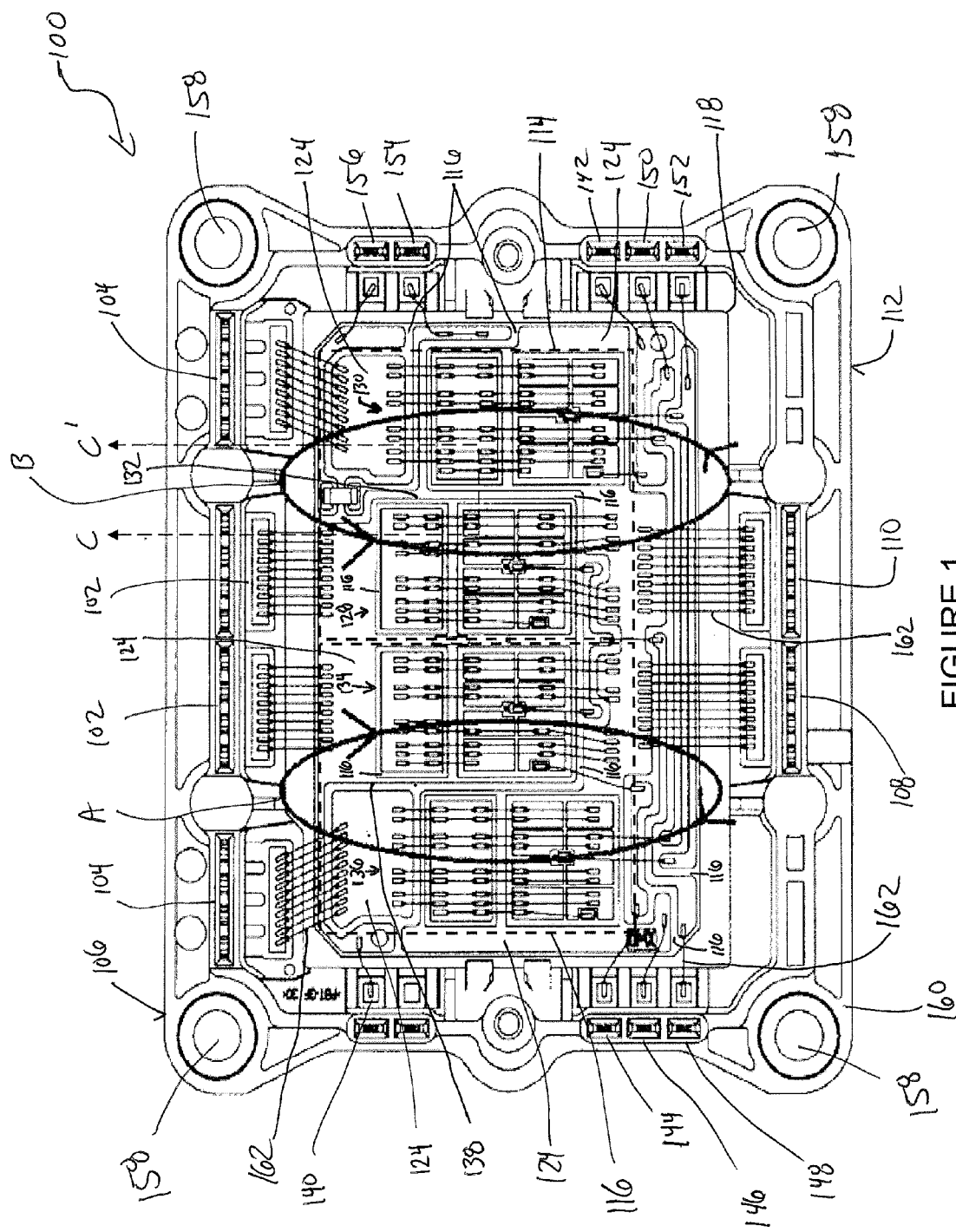
FIG. 1 illustrates a plan view of a power module.

FIG. 1 illustrates an embodiment of a power module 100 such as an IGBT module, MOSFET (metal oxide semiconductor field effect transistor) module or other type of power module. The power module 100 includes DC power terminals 102, 104 on one side 106 of the module 100 and AC power terminals 108, 110 on the other side 112 of the module 100, for example. The stray inductance within the power module 100 can be reduced with the inclusion of the features described herein. One feature is the inclusion of two power transistor circuits 114, 116 which mirror each other in design and layout. The power transistor circuits 114, 116 are interposed between the DC and AC power terminals 102, 104, 108, 110 of the module 100. Each circuit 114, 16 generates a current loop during operation. The current loops travel in the opposite direction through the respective power transistor circuits, and are indicated in FIG. 1 by the superimposed loops labelled 'A' and 'B'. These loops give rise to corresponding magnetic fields which at least partly counteract each other because the current loops flow in the opposite direction. The counteracting magnetic fields reduce the inductance associated with the current loops, which in turn reduces the stray inductance within the power module 100.

The stray inductance of the power module 100 can be further reduced by attaching the mirrored power transistor circuits 114, 116 to the same substrate 118. Where two counter rotating loops ('A' and 'B' in FIG. 1) are designed into a power module 100 as described above, the stray inductance within the module 100 can be further reduced if both loops are integrated on the same substrate 118 because such a design ensures homogeneous switching of the power transistors (i.e. prevents inhomogeneous switching of the transistors) within the power module 100.

Figure 2:
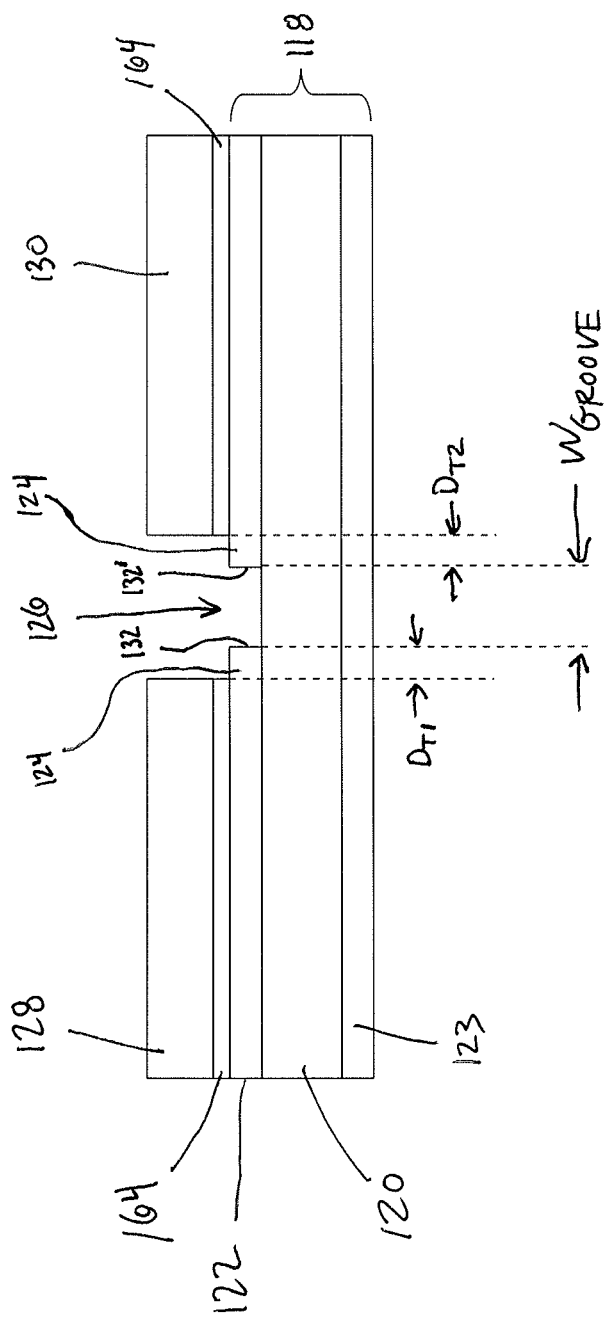
FIG. 2 illustrates a schematic cross-sectional view of the power module shown in FIG. 1.

FIG. 2 illustrates a partial cross-sectional view of the power module 100 along the line labelled C-C' in FIG. 1, including a more detailed view of the substrate 118. The substrate 118 includes an insulating member 120 such as a ceramic substrate and a patterned metallization 122 on the insulating member 120. An optional metallization 123 can be provided on the opposite side of the insulating member 120 as the patterned metallization 122 e.g. to improve the heat transfer capability of the power module 100. The substrate 118 can be a direct copper bonded (DCB) substrate, a direct aluminum bonded (DAB) substrate or an active metal brazed (AMB) substrate. Alternatively, the substrate 118 may be an insulated metal substrate (IMS) or similar substrate which includes a metal baseplate (e.g. made of aluminum or copper) covered by a dielectric layer such as epoxy and a metal layer such as copper or aluminum on the dielectric layer. In each case, the patterned metallization 122 is segmented into a plurality of spaced apart metallization regions 124. Adjacent ones of the metallization regions 124 are separated by a groove 126 which extends through the patterned metallization 122 to the underlying insulating member 120.

With reference to FIGS. 1 and 2, the first power transistor circuit 114 includes a first power switch 128 attached to a first one of the metallization regions 124 and a second power switch 130 attached to a second one of the metallization regions 124 adjacent a first side 132 of the first metallization region 124. The second power transistor circuit 116 includes a third power switch 134 attached to the same metallization region 124 as the first power switch 128 of the first circuit 114, and a fourth power switch 136 attached to a third one of the metallization regions 124 adjacent a second side 138 of the first metallization region 124 which opposes the first side 132. The power module also has a collector terminal 140, current sense terminals 142, 144, a high-side emitter terminal 146, a high-side gate terminal 148, a low-side emitter terminal 150, a low-side gate terminal 152 and additional control terminals 154, 156. Various connections 162 such as bond wire connections form the electrical connections between the terminals of the power module and the power transistor circuits 114, 116. The power module 100 also has a frame 160 with openings 158 e.g. for securing the power module 100 to a heat sink.

The second power transistor circuit 116 mirrors the first power transistor circuit 14 in design and layout. In one embodiment, the power transistor circuits 114, 116 are mirrored half-bridge circuits. The high-side switches 128, 134 of the half-bridge circuits 114, 116 may be attached to the first (middle) metallization region 124, the low-side switch 130 of the first half-bridge circuit 114 may be attached to the second (right-hand) metallization region 124 and the low-side switch 136 of the second half-bridge circuit 116 may be attached to the third (left-hand) metallization region 124 as shown in FIG. 1. Alternatively, the low-side switches 130, 136 of the half-bridge circuits 114, 116 may be attached to the first (middle) metallization region 124 and the respective high-switches 128, 134 may be attached to the corresponding adjacent metallization regions 124. Other types of power transistor circuits may be used. For example, the power transistor circuits 114, 116 may be mirrored H-bridge circuits. In each case the patterned metallization 122 of the substrate 118 is separated into regions by grooves 126, each groove acting as an insulation barrier between adjacent metallization regions.

Returning to FIG. 2, one groove 126 is shown in the patterned metallization layer 122 of the substrate 118. The groove 126 has opposing sides 132, 132' and extends to the surface of the insulating member 120 of the substrate 118. The opposing sides 132, 132' of the groove 126 define a width $W_{GROOVE}$ of the groove 126. The power switch 128 attached to the metallization region 124 adjacent one side 132 of the groove 126 is spaced apart from that side 132 of the groove 126 by a distance $D_{T1}$. The power switch 130 attached to the metallization region 124 adjacent the other (opposing) side 132' of the groove 126 is spaced apart from that side 132' of the groove 126 by a distance $D_{T2}$. The power switches 128, 130 may be attached to the respective metallization regions 124 by solder or other material 164. In one embodiment, $D_{T1}$ is 0.5 mm or less and $D_{T2}$ is 0.5 mm or less. The same or similar spacing can be used for each power switch pair (e.g. each high-side and low-side switch pair) of the mirrored power transistor circuits 114, 116. In general, the grooves 126 insulate (via the insulating member 120 of the substrate 118) the adjacent metallization regions 124 of the patterned metallization 122 from one another. By forming such grooves 126 in the patterned metallization layer 122, a single substrate 118 can be used to attach the mirrored power transistor circuits 114, 116. Such an arrangement reduces the stray inductance within the power module 100 while at the same time ensuring the power switches 128, 130, 134, 136 of each circuit 114, 16 are properly interconnected as described previously herein.

Figure 3:
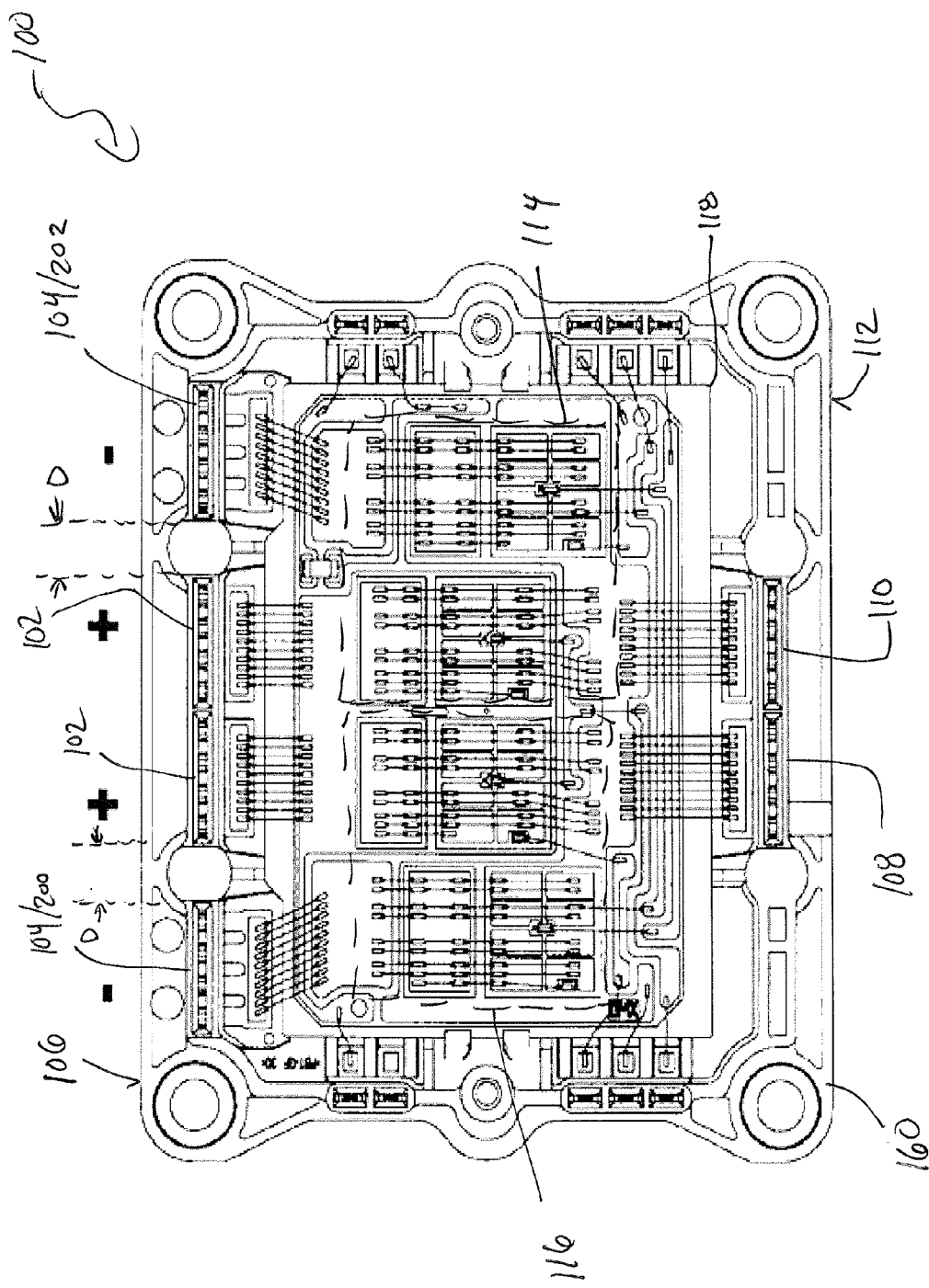
FIG. 3 illustrates a plan view of the power module shown in FIG. 1 with superimposed labels for the DC power terminals.

FIG. 3 illustrates the power module 100 of FIG. 1, with superimposed labels emphasizing the power terminal positioning. According to an embodiment, the positive (+) DC power terminals 102 and the negative (−) DC power terminals 104 are disposed along the same side 106 of the power module 100. The positive DC power terminals 102 are grouped together and collectively interposed between a first set 200 of the negative DC power terminals 104 on the left and a second set 202 of the negative DC power terminals 104 on the right. The AC power terminals 108, 110 are disposed along the opposing side 112 of the power module 100.

According to one embodiment, the power module 100 has a plastic frame 160 which houses the substrate 118 and the mirrored power transistor circuits 114, 116. The positive and negative DC power terminals 102, 104 are disposed along the same side 106 of the plastic frame 160 and spaced apart by a minimal distance (D) corresponding to the creepage distance of the plastic frame 160. The creepage distance is defined as the shortest distance on the surface of an insulating material (the plastic frame in this case) between two conductive elements (the positive and negative DC power terminal in this case). The clearance distance is defined as the shortest distance through the air between two conductive elements (the positive and negative DC power terminal in this case). The DC power terminals 102, 104 may be press-fit connectors as shown in FIG. 2, or may be any other suitable type of connector such as screw, pin or cable connectors.

Since the stray inductance is critical on the DC side of the power module 100, the positive and negative DC power terminals 102, 104 are positioned as close together as possible. In one embodiment, the distance between the positive and negative DC power terminals 102, 104 is limited by the creepage and clearance tolerances of the module 100. A theoretical lower inductance can be achieved by placing the power connections in front of one another. However such an arrangement requires that the subsequent current flow of the front connection be directed around the rear connection hence, restricting the possible cross section and increasing the stray inductance.

Figure 4:
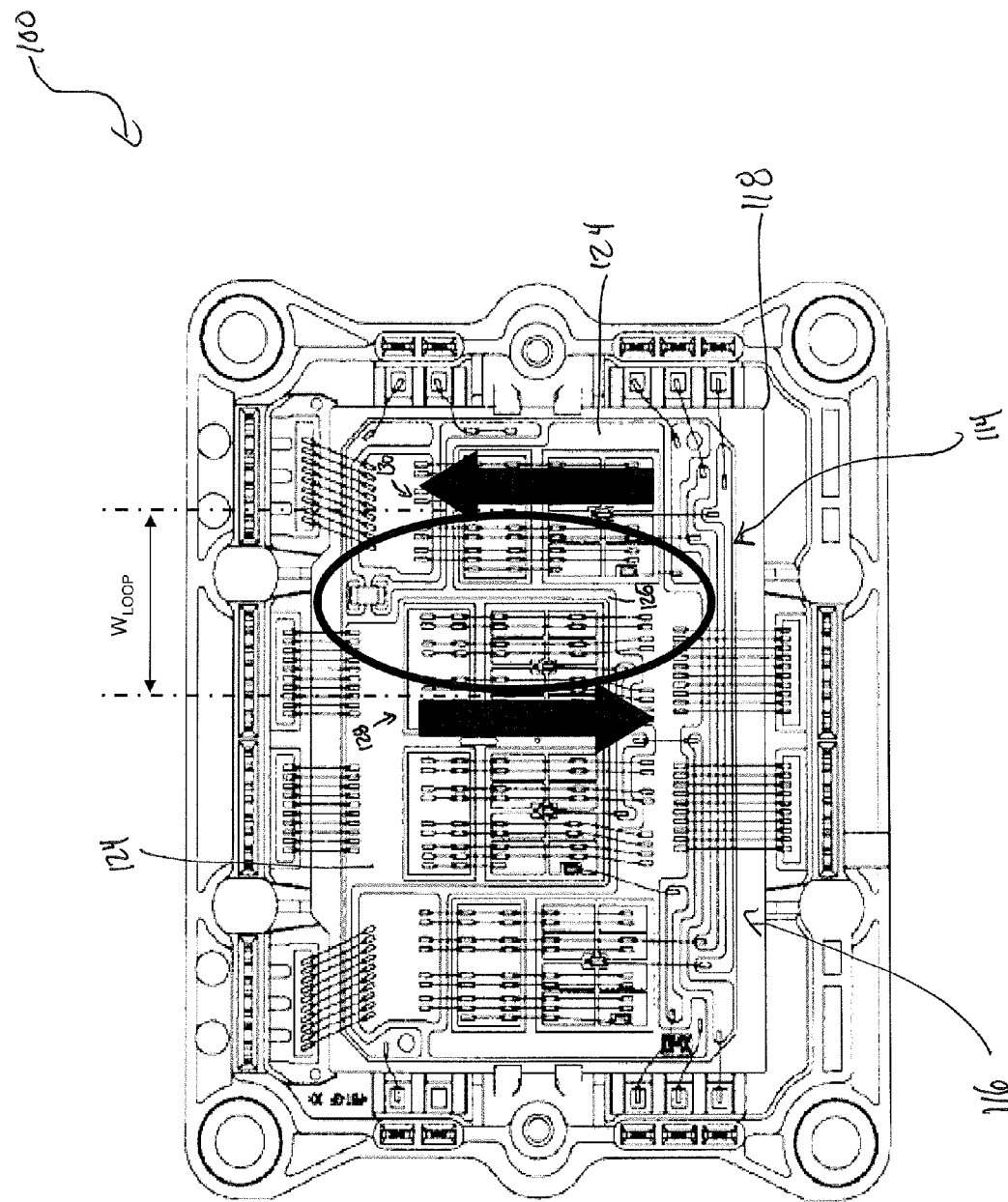
FIG. 4 illustrates a plan view of the power module shown in FIG. 1 with a superimposed indicator of a current loop within the module.

FIG. 4 illustrates the power module 100 shown in FIG. 1, with a current flow loop through the power transistor circuit 114 on the right hand side highlighted by a superimposed loop. During operation, the right-hand power transistor circuit 114 generates a current loop through the first and second power switches 128, 130. For example, the first switch 128 may be a high-side switch of a half-bridge circuit and the second switch 130 may be a low-side switch of the half-bridge circuit. The flow of current through the power module 100 preferably forms a narrowest loop as possible to minimize stray inductance. In practical terms this means that the current should flow along a first path and back along a second path with both paths lying as close to one another as possible.

The current loop shown in FIG. 4 has a width $W_{LOOP}$ corresponding to a width $W_{T1}$ of the first power switch 128, a width $W_{T2}$ of the second power switch 130, and the width $W_{GROOVE}$ of the groove 126 separating the metallization regions 124 to which the respective power switches 128, 130 are attached. The width $W_{LOOP}$ of the current loop also corresponds to a distance $D_{T1}$ between a first edge 132 of the groove 126 and a side of the first power 128 switch facing the groove 126, and a distance $D_{T2}$ between a second opposing edge 132' of the groove 126 and a side of the second power switch 130 facing the groove 126. The parameters $W_{GROOVE}$, $D_{T1}$ and $D_{T2}$ are shown in FIG. 2. For a fixed transistor width, the width of the current loop can be narrowed and therefore the stray inductance lowered by minimizing the groove width $W_{GROOVE}$ and minimizing the distance $D_{T1}$ and $D_{T2}$ between the edges 132, 132' of the groove 126 and the respective power switches 128, 130 on each side of the groove 126. The chip spacing distance $D_{T1}$ and $D_{T2}$ is limited by manufacturing parameters such as a solder tolerance associated with attaching the power switches 128, 130 to the patterned metallization 122 of the substrate 118 (e.g. enough space should be provided to allow the switches movement during the attach process). In addition, the regions of the patterned metallization 122 on which the power switches 128, 130 are attached should be separated by a large enough groove to ensure proper isolation, thus limiting how narrow the groove can be made. The same spacing considerations apply to the power switches 134, 136 of the mirroring power transistor circuit 116.

Figure 5:
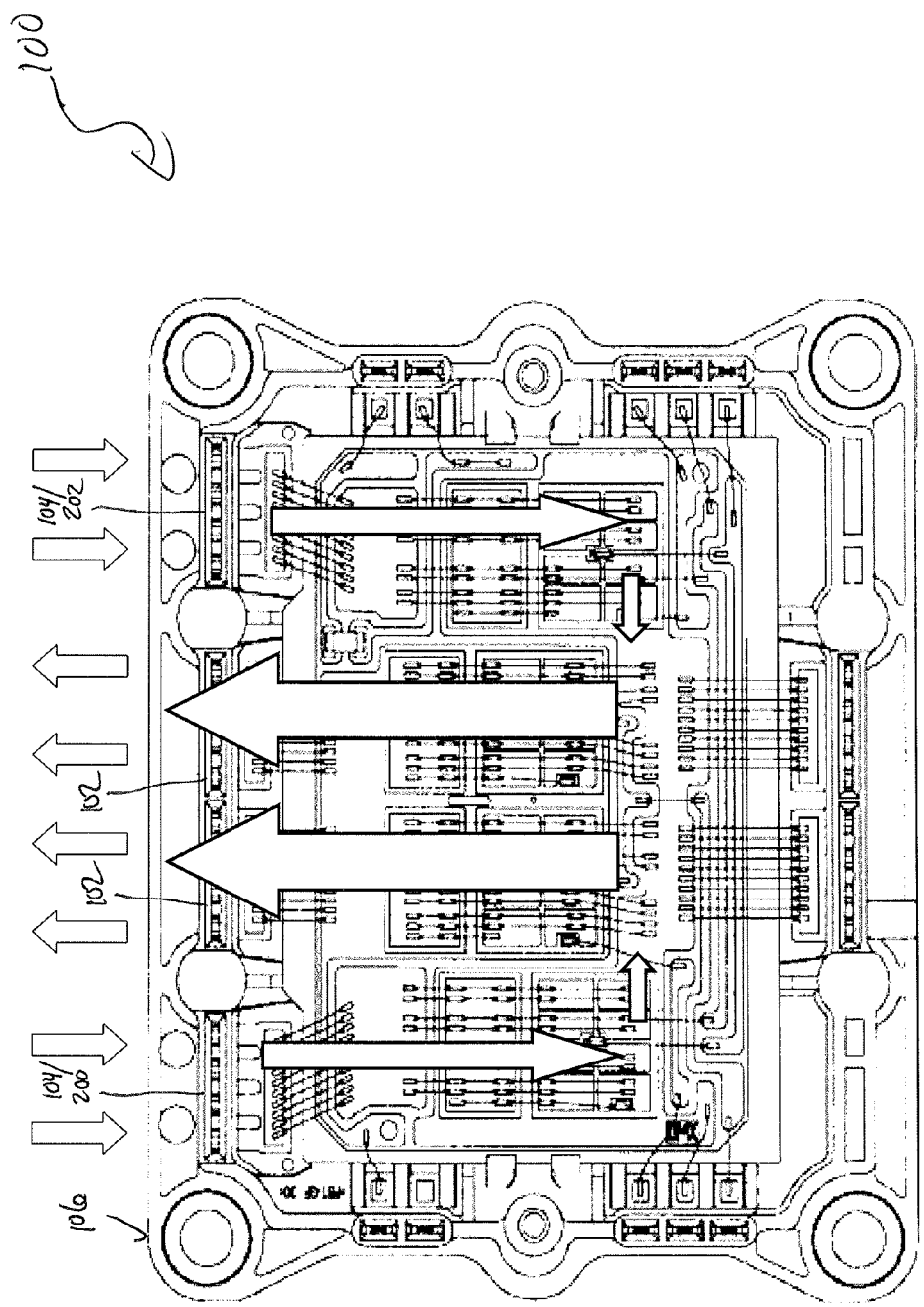
FIG. 5 illustrates a plan view of the power module shown in FIG. 1 with superimposed indicators of the external and internal current flow paths.

FIG. 5 illustrates the power module 100 shown in FIG. 1, with all DC current flow paths internal and external to the power module 100 highlighted by corresponding superimposed arrows. Reducing the stray inductance outside the power module 100 also increases the amount of power extracted from the module 100. The positive (+) DC power terminals 102 and the negative (−) DC power terminals 104 can be disposed along the same side 106 of the power module 100, and the positive DC power terminals 102 can be grouped together and collectively interposed between a first set 200 of the negative DC power terminals 104 on the left and a second set 202 of the negative DC power terminals 104 on the right as previously described herein e.g. with reference to FIG. 3. Such an arrangement of the DC power terminals 102, 104 yields a parallel band of current flow which continues from the power module 100 to the external system to which the module 100 is used. This parallel band of current flow is indicated by the corresponding arrows in FIG. 5, and reduces the stray inductance external to the power module 100.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power module, comprising:
   a substrate including an insulating member and a patterned metallization on the insulating member, the patterned metallization being segmented into a plurality of spaced apart metallization regions, adjacent ones of the metallization regions being separated by a groove which extends through the patterned metallization to the insulating member;
   a first power transistor circuit including a first power switch attached to a first one of the metallization regions and a second power switch attached to a second one of the metallization regions adjacent a first side of the first metallization region; and
   a second power transistor circuit including a third power switch attached to the first metallization region and a fourth power switch attached to a third one of the metallization regions adjacent a second side of the first metallization region which opposes the first side, the second power transistor circuit mirroring the first power transistor circuit.

2. A power module according to claim 1, wherein the first power transistor circuit is operable to generate a first current flow in a first direction and the second power transistor circuit is operable to generate a second current flow in a second direction opposite the first direction so that a magnetic field arising responsive to the first current flow is at least partly counteracted by a magnetic field arising responsive to the second current flow.

3. A power module according to claim 1, wherein the first power transistor circuit is operable to generate a current loop through the first and second power switches, the current loop having a width corresponding to a width of the first and second power switches, a width of the groove separating the first and second metallization regions, a distance between a first edge of the groove and a side of the first power switch facing the groove, and a distance between a second opposing edge of the groove and a side of the second power switch facing the groove.

4. A power module according to claim 1, wherein the substrate is a direct copper bonded substrate.

5. A power module according to claim 1, further comprising a first plurality of DC power terminals of a first polarity and a second plurality of DC power terminals of a second polarity disposed along a same side of the power module so that the first plurality of DC power terminals are grouped together and collectively interposed between a first set of the second plurality of DC power terminals and a second set of the second plurality of DC power terminals.

6. A power module according to claim 5, further comprising a plastic frame housing the substrate, the first power transistor circuit and the second power transistor circuit, and wherein the first and second plurality of DC power terminals are disposed along the same side of the plastic frame and spaced apart by a minimal distance corresponding to a creepage distance of the plastic frame.

7. A power module according to claim 1, wherein the groove separating the first and second metallization regions has a first edge and a second opposing edge, and wherein the first power switch is arranged adjacent the first edge and the second power switch is arranged adjacent the second edge.

8. A power module according to claim 7, wherein a distance between the first edge of the groove and a side of the first power switch facing the groove is 0.5 mm or less, and wherein a distance between the second edge of the groove and a side of the second power switch facing the groove is 0.5 mm or less.

9. A power module according to claim 1, wherein the groove separating the first and third metallization regions has a first edge and a second opposing edge, and wherein the third power switch is arranged adjacent the first edge and the fourth power switch is arranged adjacent the second edge.

10. A power module according to claim 9, wherein a distance between the first edge of the groove and a side of the third power switch facing the groove is 0.5 mm or less, and wherein a distance between the second edge of the groove and a side of the fourth power switch facing the groove is 0.5 mm or less.

11. A power module, comprising:
a substrate including an insulating member and a patterned metallization on the insulating member, the patterned metallization being segmented into a plurality of spaced apart metallization regions, adjacent ones of the metallization regions being separated by a groove which extends through the patterned metallization to the insulating member;
a first half-bridge circuit including a first power switch attached to a first one of the metallization regions and a second power switch attached to a second one of the metallization regions adjacent a first side of the first metallization region; and
a second half-bridge circuit including a third power switch attached to the first metallization region and a fourth power switch attached to a third one of the metallization regions adjacent a second side of the first metallization region which opposes the first side, the second half-bridge circuit mirroring the first half-bridge circuit.

12. A power module according to claim 11, wherein the first power switch is a first high side switch, the second power switch is a first low side switch, the third power switch is a second high side switch and the fourth power switch is a second low side switch.

13. A power module according to claim 11, wherein the first power switch is a first low side switch, the second power switch is a first high side switch, the third power switch is a second low side switch and the fourth power switch is a second high side switch.

14. A power module according to claim 11, wherein the first half-bridge circuit is operable to generate a first current flow in a first direction and the second half-bridge circuit is operable to generate a second current flow in a second direction opposite the first direction so that a magnetic field arising responsive to the first current flow is at least partly counteracted by a magnetic field arising responsive to the second current flow.

15. A power module according to claim 11, wherein the first half-bridge circuit is operable to generate a current loop through the first and second power switches, the current loop having a width corresponding to a width of the first and second power switches, a width of the groove separating the first and second metallization regions, a distance between a first edge of the groove and a side of the first power switch facing the groove, and a distance between a second opposing edge of the groove and a side of the second power switch facing the groove.

16. A power module according to claim 11, wherein the substrate is a direct copper bonded substrate.

17. A power module according to claim 11, further comprising a first plurality of DC power terminals of a first polarity and a second plurality of DC power terminals of a second polarity disposed along a same side of the power module so that the first plurality of DC power terminals are grouped together and collectively interposed between a first set of the second plurality of DC power terminals and a second set of the second plurality of DC power terminals.

18. A power module according to claim 17, further comprising a plastic frame housing the substrate, the first half-bridge circuit and the second half-bridge circuit, and wherein the first and second plurality of DC power terminals are disposed along the same side of the plastic frame and spaced apart by a minimal distance corresponding to a creepage distance of the plastic frame.

19. A power module according to claim 11, wherein the groove separating the first and second metallization regions has a first edge and a second opposing edge, and wherein the first power switch is arranged adjacent the first edge and the second power switch is arranged adjacent the second edge.

20. A power module according to claim 19, wherein a distance between the first edge of the groove and a side of the first power switch facing the groove is 0.5 mm or less, and wherein a distance between the second edge of the groove and a side of the second power switch facing the groove is 0.5 mm or less.

21. A power module according to claim 11, wherein the groove separating the first and third metallization regions has a first edge and a second opposing edge, and wherein the third power switch is arranged adjacent the first edge and the fourth power switch is arranged adjacent the second edge.

22. A power module according to claim 20, wherein a distance between the first edge of the groove and a side of the third power switch facing the groove is 0.5 mm or less, and wherein a distance between the second edge of the groove and a side of the fourth power switch facing the groove is 0.5 mm or less.

* * * * *